United States Patent
McKinnell et al.

(10) Patent No.: US 7,147,908 B2
(45) Date of Patent: Dec. 12, 2006

(54) SEMICONDUCTOR PACKAGE WITH GETTER FORMED OVER AN IRREGULAR STRUCTURE

(75) Inventors: James C. McKinnell, Salem, OR (US); Chien-Hua Chen, Corvallis, OR (US); Kenneth Diest, Pasadena, CA (US); Kenneth M. Kramer, Corvallis, OR (US); Daniel A. Kearl, Philomath, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/964,331

(22) Filed: Oct. 13, 2004

(65) Prior Publication Data
US 2006/0083896 A1    Apr. 20, 2006

(51) Int. Cl.
*B32B 9/04* (2006.01)
*B32B 9/06* (2006.01)
*H01L 23/20* (2006.01)

(52) U.S. Cl. ............... 428/141; 428/426; 428/446; 428/450; 428/457; 257/682

(58) Field of Classification Search ............ 428/141, 428/446, 450, 426, 432, 621; 257/682
See application file for complete search history.

(56) References Cited

U.S. PATENT DOCUMENTS

| | | | |
|---|---|---|---|
| 4,597,166 A | 7/1986 | Iwai | |
| 4,769,345 A | 9/1988 | Butt et al. | |
| 5,557,596 A | 9/1996 | Gibson et al. | |
| 5,701,008 A * | 12/1997 | Ray et al. | 250/352 |
| 5,729,052 A | 3/1998 | Tonti et al. | |
| 5,773,362 A | 6/1998 | Tonti et al. | |
| 5,829,086 A * | 11/1998 | Billek | 15/21.2 |
| 5,863,602 A | 1/1999 | Watanabe et al. | |
| 5,931,713 A * | 8/1999 | Watkins et al. | 445/55 |
| 6,074,926 A | 6/2000 | Cathey et al. | |
| 6,146,980 A | 11/2000 | Hsu | |
| 6,465,156 B1 | 10/2002 | Singh et al. | |
| 6,499,354 B1 | 12/2002 | Najafi et al. | |
| 6,543,617 B1 | 4/2003 | Angelopoulos et al. | |
| 6,548,382 B1 | 4/2003 | Henley et al. | |
| 6,566,211 B1 | 5/2003 | Graas et al. | |
| 6,624,049 B1 | 9/2003 | Yamazaki | |
| 6,635,509 B1 | 10/2003 | Ouellet | |
| 6,849,554 B1 * | 2/2005 | Rattner et al. | 438/706 |
| 2003/0141802 A1 | 7/2003 | Liebeskind et al. | |
| 2003/0207579 A1 * | 11/2003 | Rattner et al. | 438/700 |

FOREIGN PATENT DOCUMENTS

| | | |
|---|---|---|
| EP | 1 333 488 A2 | 8/2003 |
| JP | 09007135 | 8/1998 |
| JP | 2001102386 A * | 4/2001 |

OTHER PUBLICATIONS

Scientific American internet article entitled "A Decade Away: Atomic Resolution Storage", May 17, 2000, 2 pgs.

(Continued)

*Primary Examiner*—Jennifer C. McNeil
*Assistant Examiner*—Timothy M. Speer

(57) ABSTRACT

A semiconductor package includes a substrate having a first surface portion in a cavity. The first surface portion includes an artificially formed grass structure. The package includes a getter film formed over the grass structure.

21 Claims, 5 Drawing Sheets

OTHER PUBLICATIONS

Saes Getters internet article entitled "Barium Getter Features", 2 pgs.
PP/RC internet article entitled Highlights from the CERN Technology Transfer Database, Apr. 30, 2003; 4 pgs.
IBM Technical Disclosure Bulletin entitled "Getter Technique.", © Nov. 1972; 1 pg.
Lucent Technologies article entitled Blades of Nanograss.(Vacuum & Thin Films), © 2004; 1 pg.
M. Engelhardt et al. article entitled "MERIE of Polimide at High Aspect Ratios for Verticle Integratin of Chips", © 2004; 3 pgs.
Ming-Chen Hung et al. article entitled "A Tri-Layer Pattern Transfer Technique by Reactive Ion Etching", © 2004; 2 pgs.

* cited by examiner

SEMICONDUCTOR PACKAGE WITH GETTER FORMED OVER AN IRREGULAR STRUCTURE

BACKGROUND

The ability to maintain a low pressure or vacuum for a prolonged period in a microelectronic package is increasingly being sought in such diverse areas as field emission displays (FEDs), micro-electro-mechanical systems (MEMS), and atomic resolution storage devices (ARS). For example, computers, displays, and personal digital assistants may all incorporate such devices. Both FEDs and ARS devices typically have two surfaces juxtaposed to one another across a narrow vacuum gap. Typically electrons traverse this gap either to excite a phosphor in the case of FEDs or to modify a media in the case of ARS devices.

One of the major problems with vacuum packaging of electronic devices is the continuous outgassing of hydrogen, water vapor, carbon monoxide, and other components of the electronic device. To minimize the effects of outgassing, gas-absorbing materials commonly referred to as getter materials are typically used. Typically, a separate cartridge, ribbon, or pill that incorporates the getter material is inserted into the electronic vacuum package.

In conventional getter cartridges, the getter material is deposited onto a metal substrate and then activated using electrical resistance, RF, or laser power to heat the getter material to a temperature at which the passivation layer on the surface diffuses into the bulk of the material. Non-evaporable getter material is activated in a temperature range of 250°–900° C., depending on the particular material used.

Getter materials have also been deposited on flat surfaces within vacuum packages. A problem with this approach is that the surface area within the vacuum package that is available for getter deposition is typically limited. At the wafer level, there is a competition between active device area and the area available for getter. To achieve a good vacuum in a sealed package and maintain a low pressure over the lifetime of the device, a high fraction of the surface area inside the package should be getter. Providing a sufficient amount of getter material within the vacuum package is difficult when there is a limited amount of surface area available for getter deposition.

In some conventional vacuum packages, the surface area for getter deposition has been increased by forming an array of columns in a flat surface within the vacuum package. Photolithography techniques are used to define the array of columns. A problem with this approach is that the use of photolithography to define an array of columns increases the complexity and cost of making the package.

SUMMARY

One form of the present invention provides a semiconductor package. The semiconductor package includes a substrate having a first surface portion in a cavity. The first surface portion includes an artificially formed grass structure. The package includes a getter film formed over the grass structure.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
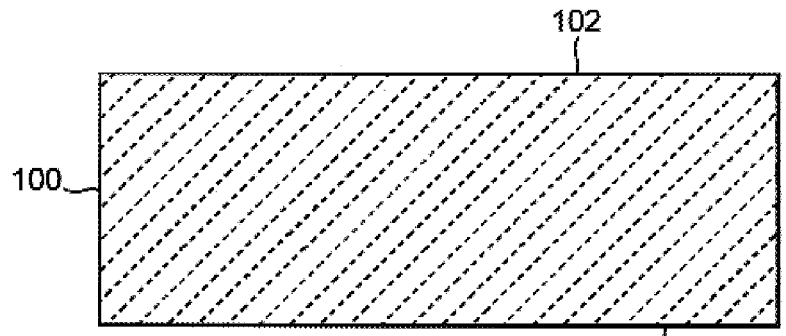
FIG. 1 is diagram illustrating a cross-sectional view of a substrate before it is processed according to one embodiment of the present invention.

FIG. 1 is a diagram illustrating a cross-sectional view of a substrate 100 before it is processed according to one embodiment of the present invention. In one embodiment, substrate 100 is a semiconductor substrate, such as a silicon wafer or a portion of a silicon wafer. In another embodiment, substrate 100 is a glass substrate (e.g., silicon dioxide or fused silica). Substrate 100 includes a top surface 102 and a bottom surface 104, which are both substantially flat surfaces. In one form of the invention, substrate 100 is processed to create a grass structure on either the top surface 102 or the bottom surface 104, or both the top surface 102 and the bottom surface 104, with the grass structure providing an increased surface area for deposition of a getter material, as described in further detail below with reference to FIGS. 2–8.

Figure 2:
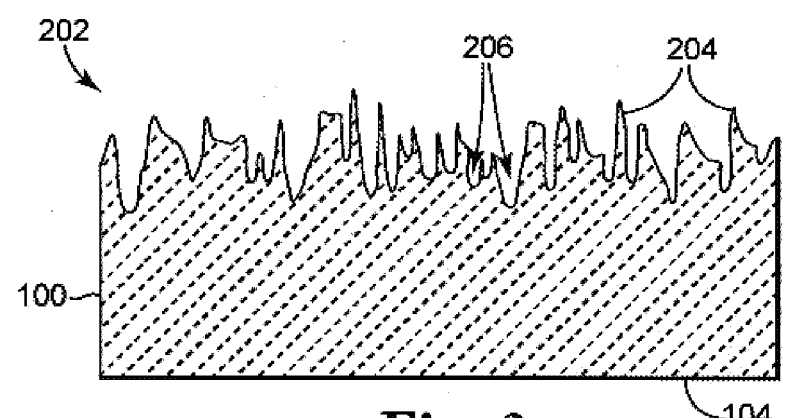
FIG. 2 is a diagram illustrating a cross-sectional view of the substrate shown in FIG. 1 with a grass structure formed on a top surface of the substrate according to one embodiment of the present invention.

FIG. 2 is a diagram illustrating a cross-sectional view of the substrate 100 shown in FIG. 1 with a "grass" structure 202 formed on a top surface of the substrate 100 according to one embodiment of the present invention. Structure 202 is referred to herein as a "grass" structure or a "silicon grass" structure because, in one embodiment, the structure 202 is formed in a silicon wafer, and has a random and irregular appearance that resembles lawn grass. In one embodiment, grass structure 202 is artificially formed in substrate 100 by performing a reactive ion etch on the top surface 102 (FIG. 1) of the substrate 100.

As shown in FIG. 2, grass structure 202 has an irregular and random arrangement of features or protruding members 204 with varying dimensions and with valleys 206 between the features 204. In one embodiment, the features 204 of grass structure 202 have a rough, substantially conical appearance, and closely resemble a plurality of stalactites or stalagmites. In one form of the invention, the features 204 of grass structure 202 have a mean height of about 1.0 to 3.0 microns, a mean width of about 0.25 to 0.75 microns, and the mean spacing between features 204 is about 0.5 to 1.0 microns.

Figure 3:
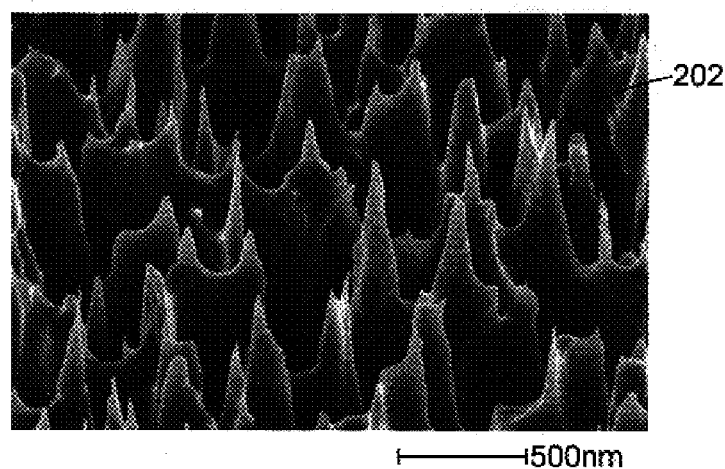
FIG. 3 is a scanning electron microscope (SEM) image illustrating a perspective view of a semiconductor substrate with a grass structure formed on a top surface of the substrate according to one embodiment of the present invention.

FIG. 3 is a scanning electron microscope (SEM) image illustrating a perspective view of a semiconductor substrate with a grass structure 202 formed on a top surface of the substrate according to one embodiment of the present invention. A scale of 500 nanometers (nm) is shown at the bottom of the SEM image shown in FIG. 3. In one embodiment, the grass structure 202 is formed across the entire top surface 102 of substrate 100 (FIG. 1) without using photolithography. In another embodiment, a photomask or shield is used to define the boundaries of a region or multiple regions of the substrate 100 on which the grass structure 202 is to be formed, with each such region including a plurality of stalactite-shaped features 204 (FIG. 2). In contrast, prior techniques that involve depositing getter on a regular array of columns use a photomask to separately define each of the individual columns in the array.

Figure 4A:
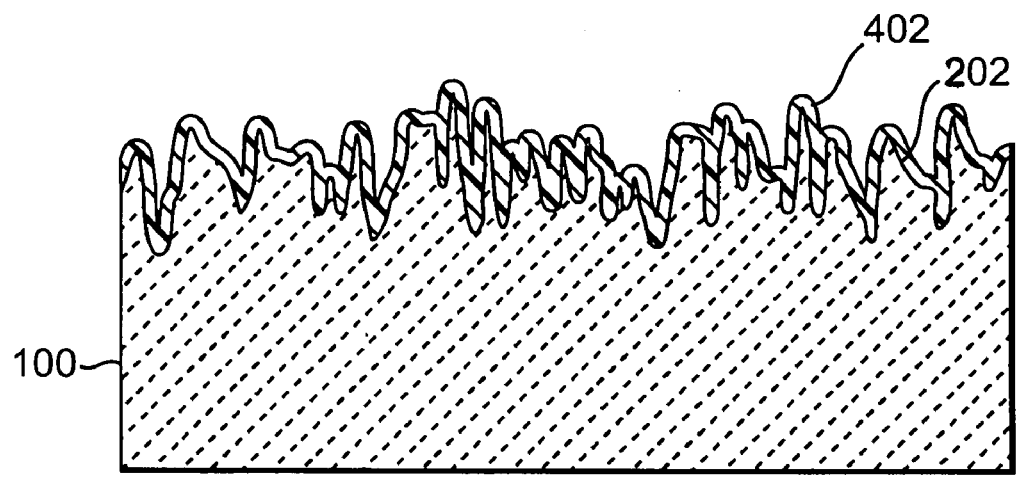
FIG. 4A is diagram illustrating a cross-sectional view of the substrate shown in FIG. 2 with a layer of getter formed on the grass structure according to one embodiment of the present invention.

FIG. 4A is a diagram illustrating a cross-sectional view of the substrate 100 shown in FIG. 2 with a layer or film of getter 402 formed on the grass structure 202 according to one embodiment of the present invention. In one form of the invention, the getter layer 402 is deposited on the grass structure 202 by sputter deposition. In one embodiment, getter layer 402 is fabricated using a non-evaporable getter material. In other embodiments, an evaporable getter material may be used. Getter materials include titanium, zirconium, thorium, hafnium, vanadium, yttrium, niobium, tantalum, and molybdenum. Preferably, getter layer 402 is a zirconium-based alloy such as zirconium-aluminum, zirconium-vanadium, zirconium-vanadium-titanium, or zirconium-vanadium-iron alloys, and more preferably zirconium-vanadium-titanium, or zirconium-vanadium-iron alloys, because of the lower activation temperatures used for these materials. In one embodiment, getter layer 402 has a uniform thickness of between about 0.1 to 2 microns. In another embodiment, getter layer 402 has a uniform thickness of between about 0.25 microns to 0.75 microns.

Incorporation of a getter covered grass structure, such as shown in FIG. 4A, into a vacuum cavity of a semiconductor package helps to maintain a vacuum in the cavity. The getter layer 402 forms a "pump" where the area and volume of getter material 402 determines the capacity of the pump. Normally, there is a passivation layer on the surface of getter material 402 when exposed to ambient conditions. However, when heated to sufficiently high temperatures, the passivation layer diffuses into the bulk of getter layer 402, resulting in activation of getter layer 402. This process of activation forms a clean surface upon which additional material may adsorb. In one embodiment, getter layer 402 is activated by heating the semiconductor package in an oven. In other embodiments, radio frequency (RF), laser power, or other heat sources may be used to activate getter layer 402. The actual temperature used for activation depends on the particular composition of getter layer 402 and is preferably in the range of about 250° to about 450° C.

Figure 4B:
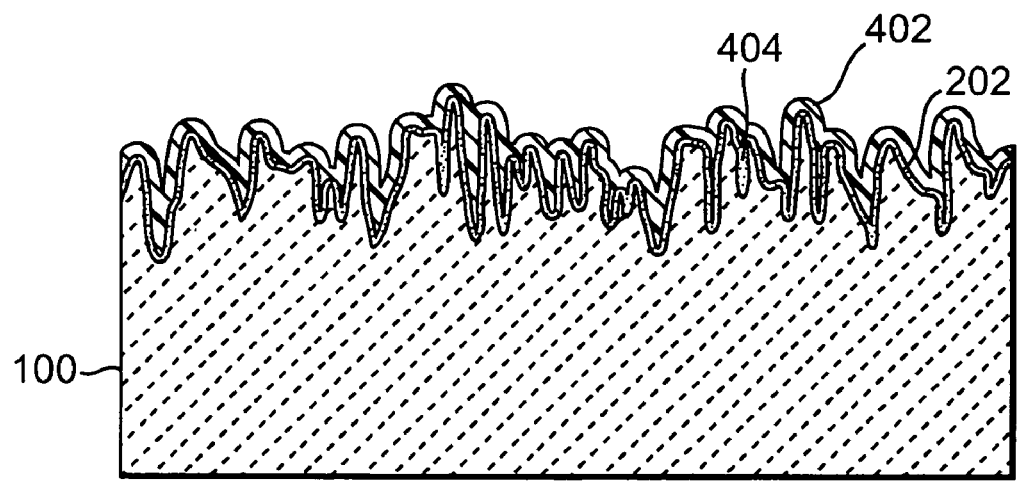
FIG. 4B is a diagram illustrating a cross-sectional view of the substrate shown in FIG. 2 with an adhesion layer formed on the grass structure and a getter layer formed on the adhesion layer according to one embodiment of the present invention.

FIG. 4B is a diagram illustrating a cross-sectional view of the substrate 100 shown in FIG. 2 with an adhesion layer 404 formed on the grass structure 202 and a getter layer 402 formed on the adhesion layer 404 according to one embodiment of the present invention. In the embodiment shown in FIG. 4A, the getter layer 402 is deposited directly on the grass structure 202. In the embodiment shown in FIG. 4B, an adhesion layer 404 is deposited on the grass structure 202, and then the getter layer 402 is deposited on the adhesion layer 404. The adhesion layer 404 is used in one embodiment to improve the adhesion between the getter layer 402 and the grass structure 202. In one form of the invention, the adhesion layer 404 and the getter layer 402 are both deposited by sputter deposition. In one embodiment, the adhesion layer 404 is tantalum (Ta), and has a thickness of about 300 angstroms. In another embodiment, the adhesion layer 404 is Ti or TiW. In yet another embodiment, the adhesion layer 404 is made from any of the getter materials listed above, or another material having adhesive properties. In one form of the invention, the adhesion layer 404 has a thickness in the range of 100 to 1000 angstroms.

Figure 5:
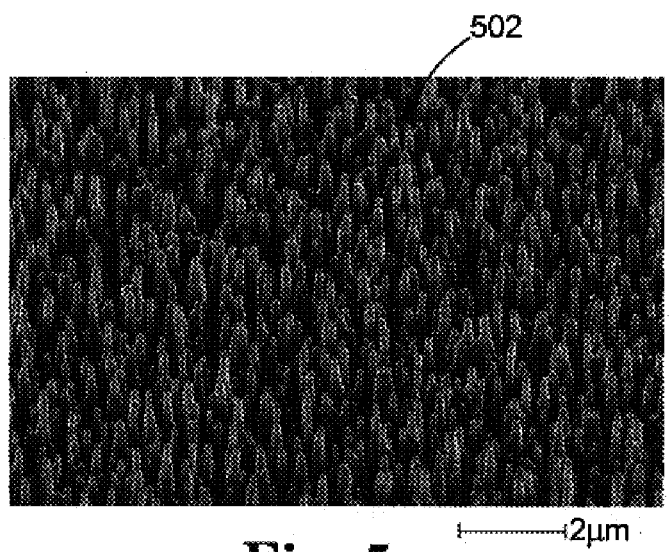
FIG. 5 is an SEM image illustrating a perspective view of a semiconductor substrate with a getter covered grass structure formed on a top surface of the substrate according to one embodiment of the present invention.

FIG. 5 is an SEM image illustrating a perspective view of a semiconductor substrate with a getter covered grass structure 502 formed on a top surface of the substrate according to one embodiment of the present invention. A scale of 2 micrometers (µm) is shown at the bottom of the SEM image shown in FIG. 5. The getter layer in the embodiment shown in FIG. 5 is relatively thin (e.g., about 0.1 microns) and provides a conformal coating of the grass structure, so the getter covered grass structure 502 has substantially the same shape as the grass structure itself. Compared to a conventional flat surface for the deposition of a getter material, the grass structure 202 (FIG. 2) greatly increases the available surface area on which the getter material is deposited. A greater height of the features 204 of the grass structure 202 and a greater number of such features 204 increase the total getter surface area.

Figure 6:
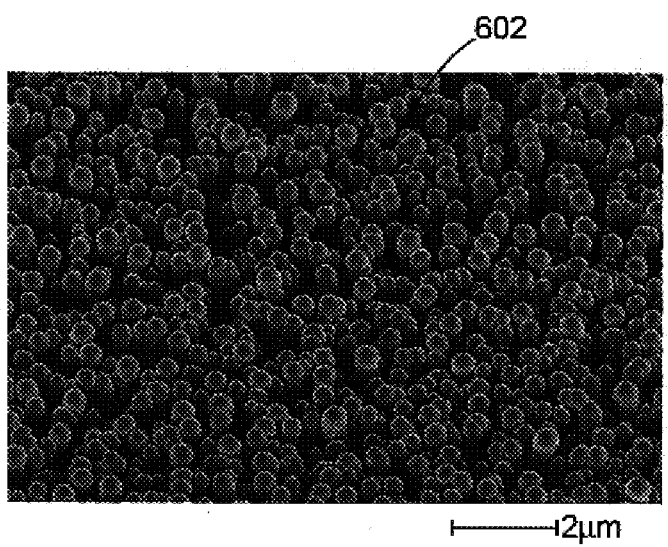
FIG. 6 is an SEM image illustrating a perspective view of a semiconductor substrate with a getter covered grass structure formed on a top surface of the substrate according to another embodiment of the present invention.

FIG. 6 is an SEM image illustrating a perspective view of a semiconductor substrate with a getter covered grass structure 602 formed on a top surface of the substrate according to one embodiment of the present invention. A scale of 2 micrometers (µm) is shown at the bottom of the SEM image shown in FIG. 6. The getter layer in the embodiment shown in FIG. 6 is thicker than the getter layer in the embodiment shown in FIG. 5, and the resulting getter covered grass structure 602 has peaks that are more rounded than those shown in FIG. 5. As the thickness of the getter layer increases, the getter covered features of the grass structure become larger and more rounded, and the overall surface area of the getter layer decreases. In one embodiment, the getter layer 402 (FIGS. 4A and 4B) is deposited at a thickness that has a high surface area for gettering most gases but a sufficient volume for absorbing hydrogen.

Figure 7:
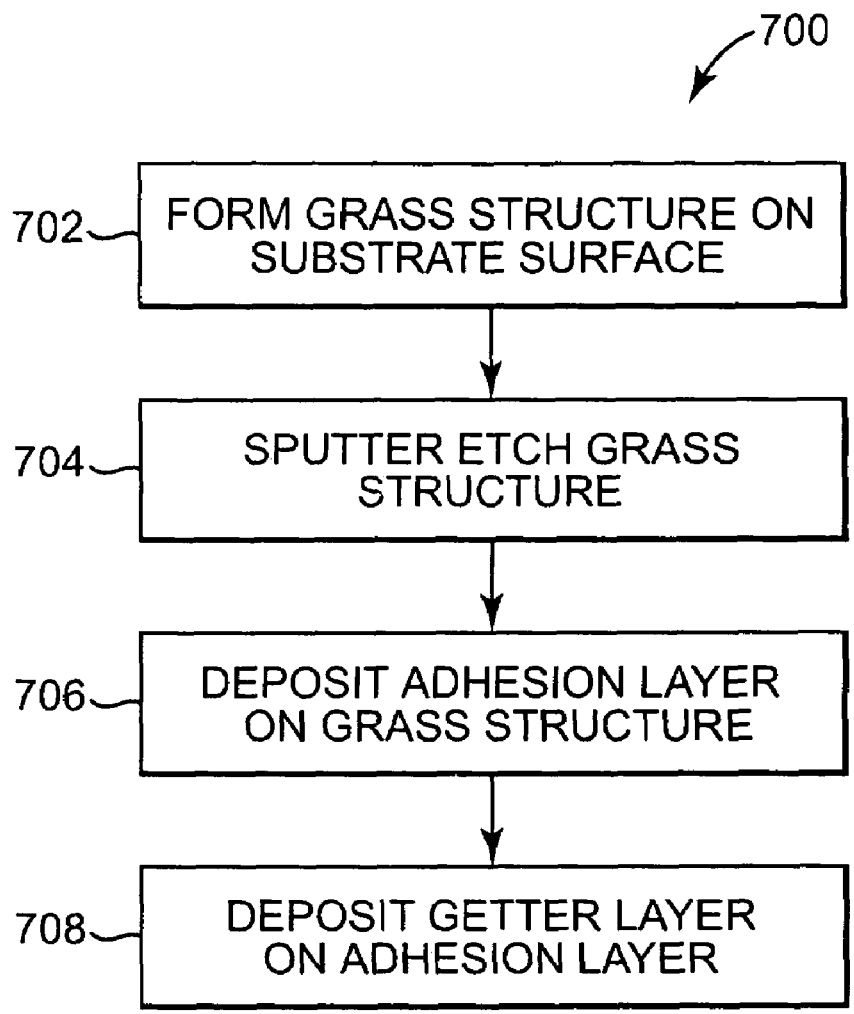
FIG. 7 is a flow diagram illustrating a method for processing a substrate according to one embodiment of the present invention.

FIG. 7 is a flow diagram illustrating a method 700 for processing a substrate according to one embodiment of the present invention. At 702, a grass structure 202 (FIG. 2) is formed in a surface of a substrate 100. In one embodiment, the grass structure 202 is formed by a reactive ion etch process. In one form of the invention, the grass structure 202 is formed with an advanced silicon etch process using a conventional dry etch tool with an inductively coupled plasma system. In one embodiment, the etch process involves a periodic etch, polymer deposition, etch, polymer deposition, etc., process, with an etch cycle of nine seconds, a passivation cycle of nine seconds, and a total etch time of ten minutes. A goal in the etch process is to create an imbalance of higher passivation than etch performance, thereby creating inefficient etch conditions. This condition causes micromasking at the etch surface, which causes a reduced etch rate and creates etch tunneling and grass type features 204 (FIG. 2) to be etched at the surface of the substrate 100.

In another form of the invention, the grass structure 202 is formed at 702 by depositing a thin metal layer on the substrate 100 to serve as a mask, annealing the metal layer to cause the metal layer to agglomerate into islands of the desired size and spacing, and then using this metal layer as an etch mask for the underlying substrate 100 during the etch process. In one embodiment, the metal layer is gold deposited by evaporation or sputter deposition, with a thickness in the range of 20–100 angstroms. In one form of the invention, the annealing of the gold layer is done in a rapid anneal system for a time in the range of 10 seconds to 10 minutes, and at a temperature in the range of 300°–700° C. In one embodiment, the etch process continues until the thin metal mask layer is completely removed so that the metal layer does not interfere with the getter film chemistry.

At 704, a sputter etch is performed on the grass structure 202 to remove the native oxide on the grass structure 202. At 706, an adhesion layer 404 is deposited on the grass structure 202. In one embodiment, the adhesion layer 404 is deposited by sputter deposition. At 708, a getter layer 402 or 602 is deposited on the adhesion layer 404. In one embodiment, the getter layer 402 or 602 is deposited by sputter deposition. In another embodiment of the present invention, an adhesion layer 404 is not used, and the getter layer 402 or 602 is deposited directly on the grass structure 202 as shown in FIG. 4A.

In another form of the invention, at 708 in method 700, the getter layer 402 or 602 is an evaporable getter material, which is deposited on the adhesion layer 404 (or directly on the grass structure 202) by evaporation. In one embodiment, the evaporable getter material is barium (Ba). In one form of the invention, at step 708, the method 700 uses a thermite reaction between $BaAl_4$ and Ni to release Ba inside a sealed package, and thereby form the barium getter layer 402 or 602. In another form of the invention, at 708 in method 700, the $BaAl_4$ and Ni mixture is deposited as alternating layers inside a package, and a laser is used to heat the layers and initiate the reaction. The reaction causes the Ba to be released in the package and form the barium getter layer 402 or 602.

Figure 8:
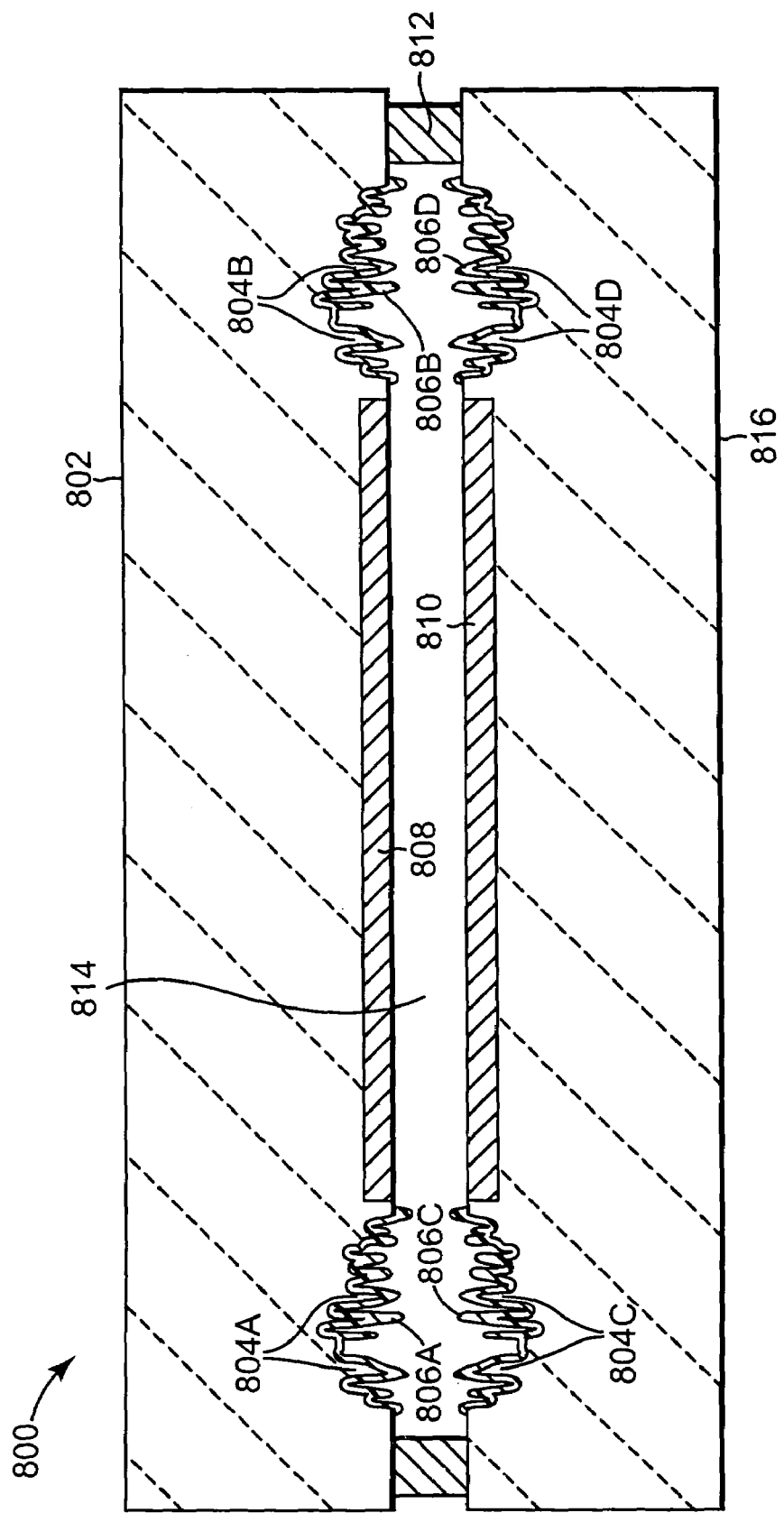
FIG. 8 is diagram illustrating a cross-sectional view of a hermetically-sealed microelectronic package with a plurality of getter covered grass structures according to one embodiment of the present invention.

FIG. 8 is diagram illustrating a cross-sectional view of a hermetically-sealed microelectronic package or device 800 with a plurality of getter covered grass structures according to one embodiment of the present invention. Microelectronic package 800 is also referred to herein as semiconductor package 800. Microelectronic package 800 includes top substrate 802 and bottom substrate 816, which are connected together via seal ring 812. A vacuum cavity 814 is defined within the package 800 by the substrates 802 and 816, and the seal ring 812. In one embodiment, vacuum cavity 814 is maintained at a pressure of less than $10^{-3}$ torr. In another embodiment, vacuum cavity 814 is maintained at a pressure of less than $10^{-5}$ or $10^{-6}$ torr. In one form of the invention, substrates 802 and 816 are semiconductor substrates. In one embodiment, substrates 802 and 816 are silicon die. In another embodiment, at least one of the substrates 802 and 816 is a glass substrate. In one form of the invention, substrate 802 is a semiconductor substrate, and substrate 816 is a glass substrate. Top substrate 802 includes an active region 808 formed on a bottom surface of the substrate 802. Bottom substrate 816 includes an active region 810 formed on a top surface of the substrate 816. In one embodiment, at least one semiconductor device is formed in each of the active regions 808 and 810.

Grass structures 804A and 804B are formed in the bottom surface of the substrate 802 adjacent to the active region 808. Grass structures 804C and 804D are formed in the top surface of the substrate 816 adjacent to the active region 810. Getter layers 806A–806D (collectively referred to as getter layers 806) are formed over grass structures 804A–804D (collectively referred to as grass structures 804), respectively. In another embodiment of the present invention, grass structures 804 and getter layers 806 are formed on one of the substrates 802 or 816, rather than both of the substrates 802 and 816. In one embodiment, grass structures 804 are formed by a reactive ion etch process, and getter layers 806 are deposited by a sputter deposition process. In one embodiment, during sealing of the microelectronic package 800, the package 800 is heated to activate the getter layers 806. The actual temperature used for activation depends on the particular composition of the getter layers 806 and is preferably in the range of about 250° to about 450° C.

By creating grass structures 804 in the surfaces of substrates 802 and 816, the available surface area for depositing getter within vacuum cavity 814 is greatly increased. In one embodiment, the grass structures 804 are formed without using lithographic patterning to define each individual feature of the grass structures 804.

In one form of the invention, substrates 802 and 816 are semiconductor die that include semiconductor devices for providing electronic functionality, and substrates 802 and 816 also form part of the package itself. In one embodiment, microelectronic package 800 is an atomic resolution storage (ARS) device or a field emission display (FED) device with an electron emitter for emitting electrons across the vacuum cavity 814. The emitted electrons traverse the vacuum cavity 814 to excite a phosphor in the case of a FED device or to modify a media in the case of an ARS device. In another embodiment, microelectronic package 800 is a micro-electro-mechanical system (MEMS) device.

One form of the present invention provides a grass structure to increase the surface area of a getter material and thereby increase the getter capacity and improve the efficiency of removing gas molecules in a vacuum-sealed electronic package. To achieve a very low pressure vacuum (e.g., pressures of $10^{-5}$ or $10^{-6}$ torr or less), a large getter surface area is desired. By depositing the getter on etched silicon grass according to one embodiment, it is possible to increase the getter surface area and thereby improve the ultimate vacuum of the package. Embodiments of the present invention are particularly useful in microelectronic or micro-electro-mechanical systems where an ultra-high vacuum is needed and silicon area is limited.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a substrate having a first surface portion in an enclosed cavity, the first surface portion including an artificially formed grass structure, wherein the grass structure comprises an irregular arrangement of protruding members;
   a getter film formed over the grass structure; and
   an adhesion layer formed on the grass structure, and wherein the getter film is formed on the adhesion layer.

2. The semiconductor package of claim 1, wherein the protruding members are one of substantially stalactite-shaped and substantially conically-shaped.

3. The semiconductor package of claim 1, wherein the protruding members having varying dimensions.

4. The semiconductor package of claim 1, wherein the grass structure is formed by reactive ion etching.

5. The semiconductor package of claim 1, wherein the getter film is formed over the grass structure by sputter deposition.

6. The semiconductor package of claim 1, wherein the getter film comprises a non-evaporable getter material.

7. The semiconductor package of claim 6, wherein the non-evaporable getter material comprises a metal selected from the group consisting of molybdenum, titanium, thorium, hafnium, zirconium, vanadium, yttrium, niobium, tantalum, and combinations thereof.

8. The semiconductor package of claim 6, wherein the non-evaporable getter material is a zirconium based alloy.

9. The semiconductor package of claim 8, wherein the non-evaporable getter material is one of a zirconium-vanadium-titanium alloy and a zirconium-vanadium-iron alloy.

10. The semiconductor package of claim 1, wherein the getter film comprises an evaporable getter material.

11. The semiconductor package of claim 10, wherein the evaporable getter material is barium.

12. The semiconductor package of claim 1, wherein the adhesion layer is one of Ta, Ti, and TiW.

13. The semiconductor package of claim 1, wherein the grass structure is formed without using lithographic techniques to define individual features of the grass structure.

14. The semiconductor package of claim 1, wherein the substrate is a semiconductor substrate.

15. The semiconductor package of claim 14, wherein the semiconductor substrate is a silicon wafer.

16. The semiconductor package of claim 1, wherein the substrate is a glass substrate.

17. The semiconductor package of claim 1, wherein the semiconductor package is one of an atomic resolution storage (ARS) device, a field emission display (FED) device, and a micro-electro-mechanical systems (MEMS) device.

18. The semiconductor package of claim 1, wherein the cavity is a low-pressure cavity.

19. The semiconductor package of claim 1, wherein the cavity is a vacuum cavity.

20. The semiconductor package of claim 1, wherein the grass structure is formed by depositing a metal layer over the substrate, annealing the metal layer, and etching the metal layer and the substrate.

21. A semiconductor package, comprising:
   a substrate having a first surface portion in a cavity, the first surface portion including an artificially formed grass structure;
   a getter film formed over the grass structure; and
   an adhesion layer formed on the grass structure, and wherein the getter film is formed on the adhesion layer.

* * * * *